United States Patent [19]
Stave

[11] Patent Number: 6,154,078
[45] Date of Patent: *Nov. 28, 2000

[54] SEMICONDUCTOR BUFFER CIRCUIT WITH A TRANSITION DELAY CIRCUIT

[75] Inventor: Eric J. Stave, Meridian, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 09/003,832

[22] Filed: Jan. 7, 1998

[51] Int. Cl.⁷ ...................................................... H03K 5/13
[52] U.S. Cl. ...................... 327/263; 327/264; 327/278; 327/285; 327/261; 327/272
[58] Field of Search ..................... 327/108, 261, 327/285, 262, 264, 281, 272, 263, 278

[56] References Cited

U.S. PATENT DOCUMENTS

| | | | |
|---|---|---|---|
| 5,343,086 | 8/1994 | Fung et al. | 327/530 |
| 5,459,424 | 10/1995 | Hattori | 327/278 |
| 5,517,131 | 5/1996 | Tien et al. | 327/541 |
| 5,920,221 | 7/1999 | Shen et al. | 327/264 |

OTHER PUBLICATIONS

Morgan et al. ("Get a Controlled Delay and Ramp with a Single CMOS Inverter Package'", electronic Design, Mar. 1978.

*Primary Examiner*—Dinh T. Le
*Attorney, Agent, or Firm*—Kirkpatrick & Lockhart LLP

[57] ABSTRACT

The present invention is directed to a transition delay circuit. The transition delay circuit includes a delay circuit which is responsive to an input signal. The transition delay circuit produces an output signal at a common node. The transition delay circuit also includes a first MOS capacitor connected between the input signal and the common node and a second MOS capacitor connected between the input signal and the common node. A method for delaying an input signal to a buffer circuit is also disclosed.

11 Claims, 13 Drawing Sheets

SEMICONDUCTOR BUFFER CIRCUIT WITH A TRANSITION DELAY CIRCUIT

BACKGROUND OF THE INVENTION

1. Field of the Invention

The present invention is directed generally to input buffer circuits, and, more particularly, to a transition delay circuit for use in input buffer circuits.

2. Description of the Background

In a semiconductor device, it is desirable to include a buffer circuit which buffers the device input signals before they are communicated to the internal circuitry of the device. A buffer circuit typically adapts the device input signals to internally required signal properties, such as signal voltage levels and transition delays, that must be present for the internal circuitry to operate correctly.

FIG. 1 illustrates a prior art buffer 10 constructed using complementary metal oxide semiconductor (CMOS) technology. The buffer 10 is constructed as an inverter, with a p-type transistor 12 and an n-type transistor 14. Input signal IN is input to the gate terminals of the transistor 12 and the transistor 14. If the signal IN exceeds a threshold voltage value, the transistor 14 is turned "on" and output signal OUT has a path to ground through the transistor 14. If the signal IN is below a certain threshold voltage value, the transistor 12 is turned "on" and the signal OUT is connected to VCC through the transistor 12.

The buffer 10 in FIG. 1 has the disadvantage that it is susceptible to noise and voltage surges. The buffer 10 has the further disadvantage that improper operation of the buffer 10 due to variations in operating conditions cannot be effectively corrected after the buffer 10 is constructed.

FIG. 2 illustrates a prior art buffer 16 that was designed to eliminate certain of the disadvantages of the buffer 10 of FIG. 1. The buffer 16 is constructed of a series of inverter circuits 18, 20, 22, and 24 which receive an input signal IN. A p-type MOS capacitor 26 is connected between VCC and the output of the inverter 22. An n-type MOS capacitor is connected between the output of the inverter 22 and GND.

The inverters 18, 20, and 22 and the capacitors 26 and 28 comprise a delay circuit 30. The MOS capacitors introduce a delay into the delay circuit 30. Where the input signal IN transitions from a high logic state to a low logic state, a node 29, which is connected to the gate terminals of the capacitors 26 and 28, transitions from a low logic state to a high logic state after a delay introduced by the inverters 18, 20, and 22. As the node 29 transitions, the gate terminal of the n-type capacitor 26 pulls majority carriers (electrons) from the substrate causing capacitance to be formed. This capacitance introduces a delay into the delay circuit 30.

When the input signal IN transitions from a low logic state to a high logic state, the node 29 transitions from a high logic state to a low logic state. As the node 29 transitions, the gate terminal of the p-type capacitor 28 pulls majority carriers (holes) from the substrate causing capacitance to be formed. This capacitance introduces a delay into the delay circuit 30.

The MOS capacitors 26 and 28 provide for an adjustable delay in the delay circuit 30 because they may be "trimmed" of excess material to achieve the desired delay that is introduced by the capacitors 26 and 28. The buffer 16 has the disadvantage that the delay, as measured by the time elapsed between the introduction of the input signal IN to the inverter 18 and the appearance of the output signal OUT at the output of the inverter 24, associated with low to high transitions of the signal IN is not consistent with the delay associated with high to low transitions of the signal IN.

Thus, the need exists for a transition delay circuit that may be incorporated into a buffer to provide similar low to high and high to low input transition delay times.

SUMMARY OF THE INVENTION

The present invention, according to its broadest implementation, is directed to a transition delay circuit which includes a delay circuit that is responsive to an input signal. The delay circuit produces an output signal at a common node. The transition delay circuit also includes a first MOS capacitor connected between the input signal and the common node and a second MOS capacitor connected between the input signal and the common node.

The present invention also contemplates a buffer circuit which includes a transition delay circuit and an inverter responsive to the transition delay circuit. A semiconductor device comprising a plurality of buffer circuits having transition delay circuits and a functional circuit responsive to the buffer circuit is also disclosed.

The present invention further contemplates a system which includes a processor having at least one buffer circuit, a memory controller having at least one buffer circuit, a plurality of memory devices, each having at least one buffer circuit, a first bus connecting the processor and the memory controller, and a second bus connecting the memory controller and the memory devices. The buffer circuits include a transition delay circuit and an inverter responsive to the transition delay circuit.

The present invention also contemplates a method for delaying an input signal to a buffer circuit. The method includes the steps of inputting the input signal to a delay circuit and two MOS capacitors. One of the MOS capacitors is charged to produce a delayed signal and the delayed signal is outputted.

The present invention represents a substantial advance over prior buffers. Because the present invention has a feed-forward transition delay circuit, the low to high and high to low transitions of the input signal have approximately the same delays as measured from the time the transitioning input signal is introduced to the buffer and the time the signal appears at the output of the buffer. This unexpected advantage, and other advantages and benefits of the present invention, will become apparent from the Detailed Description of the Preferred Embodiments hereinbelow.

BRIEF DESCRIPTION OF THE DRAWINGS

For the present invention to be clearly understood and readily practiced, the present invention will be described in conjunction with the following figures, wherein.

DETAILED DESCRIPTION OF THE PREFERRED EMBODIMENTS

It is to be understood that the figures and descriptions of the present invention have been simplified to illustrate elements that are relevant for a clear understanding of the present invention, while eliminating, for purposes of clarity, many other elements found in a typical buffer circuit. Those of ordinary skill in the art will recognize that other elements are desirable and/or required to implement a device, such as a memory device, incorporating the present invention. However, because such elements are well known in the art, and because they do not facilitate a better understanding of the present invention, a discussion of such elements is not provided herein.

Figure 3:
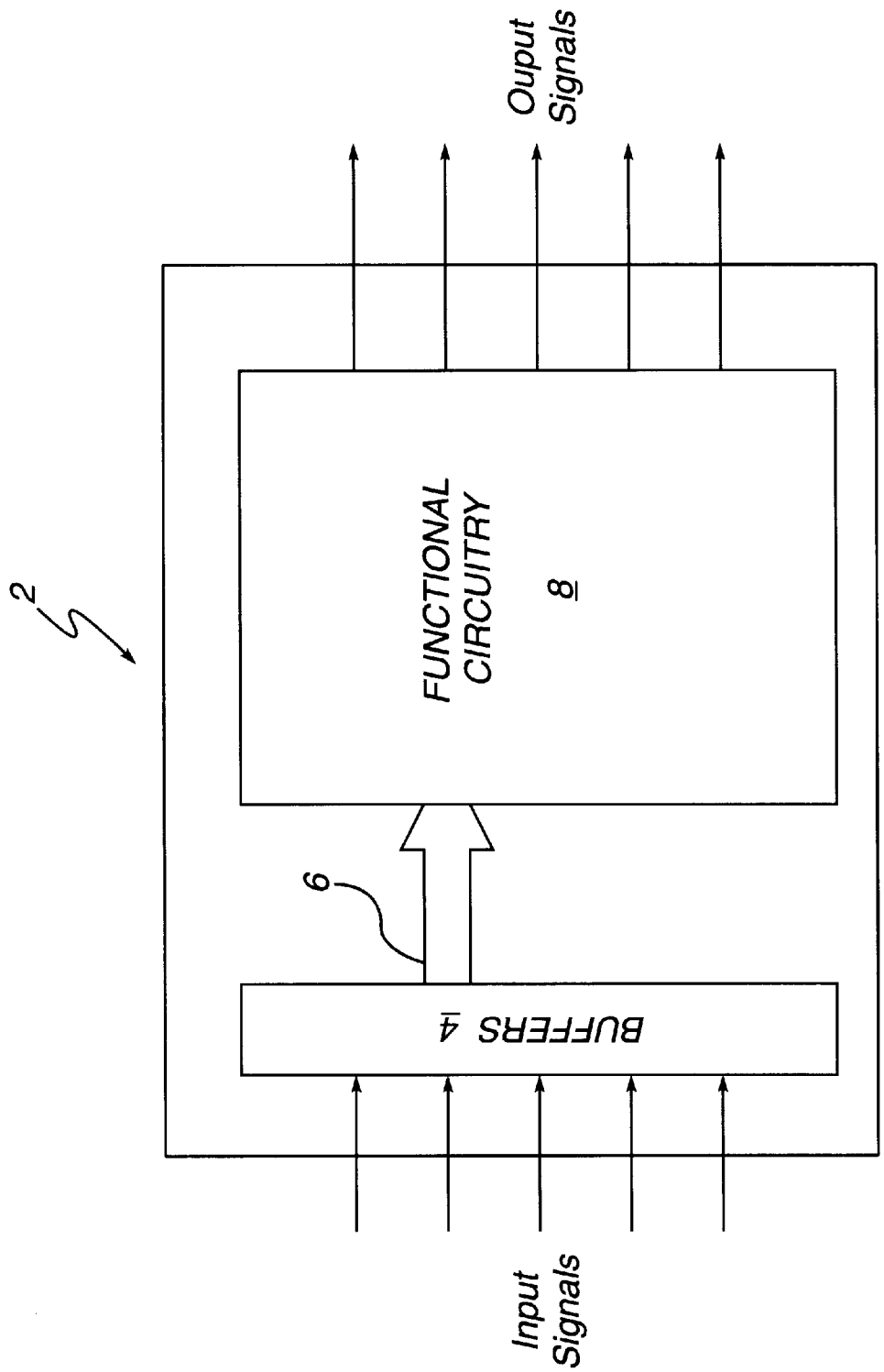
FIG. 3 is a circuit diagram of a semiconductor memory device that includes input buffers.

FIG. 3 illustrates a semiconductor device 2. The semiconductor device 2 may be any type of semiconductor device, such as, for example, a memory device or a microprocessor. Input signals enter the device 2 through input buffers 4, which adapt the input signals to the voltage levels required by the device 2. The buffers 4 may include transition delay circuits, such as the type disclosed herein in conjunction with the present invention. The buffers 4 provide signals, which are transmitted via a bus 6, to functional circuitry 8. The circuitry 8 may perform a number of functions depending on the function of the device 2. The circuitry 8 generates output signals which are transmitted outside the device 2.

Figure 4:
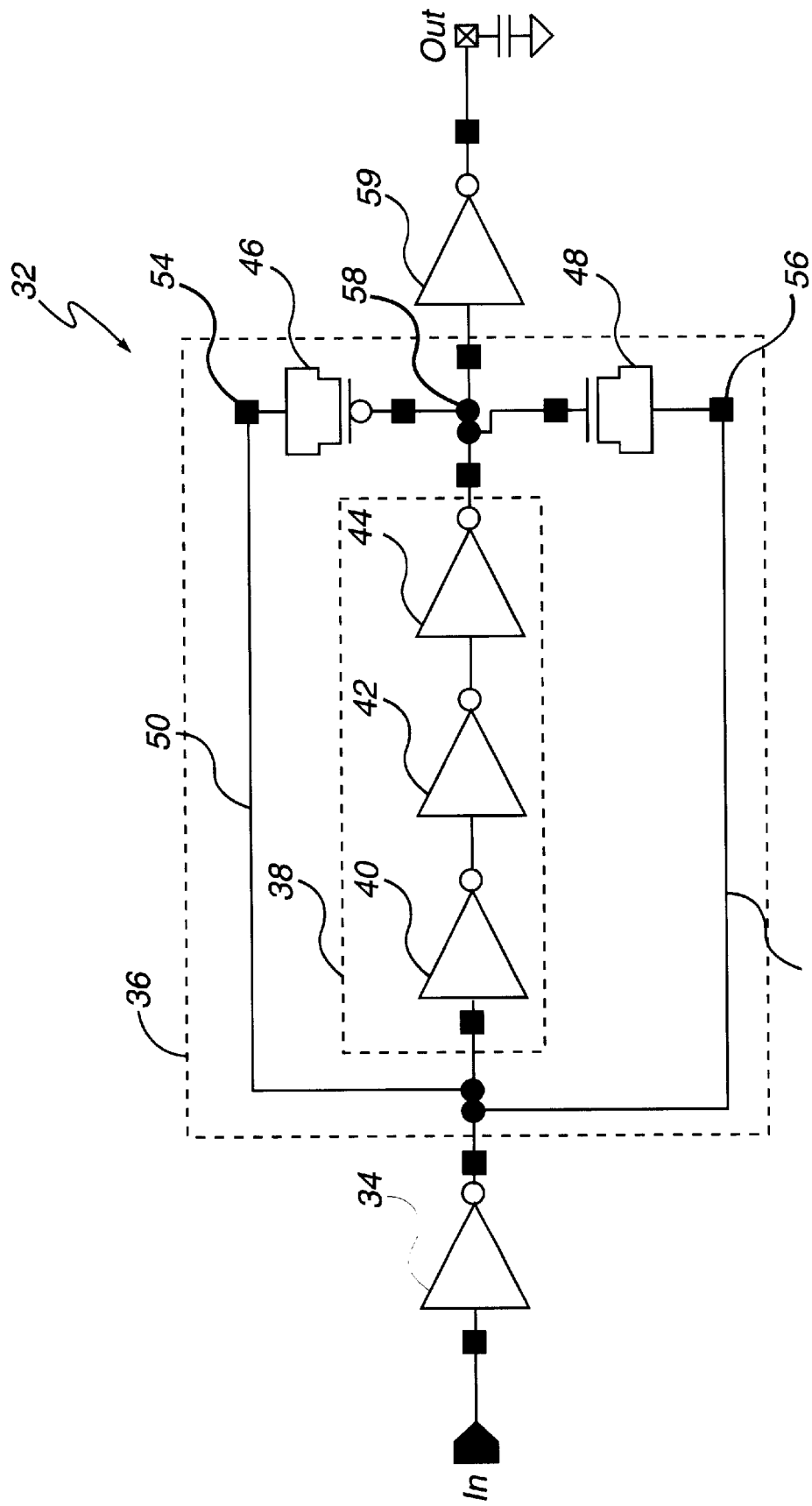
FIG. 4 is a circuit diagram of a preferred embodiment of a buffer with transition delay circuit of the present invention.

FIG. 4 shows a circuit diagram of a buffer 32. The buffer 32 may be any type of buffer, such as an input buffer, a leveling circuit, or a converter circuit, in which it is necessary to delay an input signal.

In the buffer 32 of FIG. 4, an inverter 34 receives an input signal IN. The output of the inverter 34 is input to a transition delay circuit 36. The transition delay circuit 36 has an inverter delay circuit 38, which delays the input signal IN. The delay circuit 38 is comprised of a number of inverters, and, in the preferred embodiment shown in FIG. 3, is comprised of three inverters 40, 42, and 44.

The transition delay circuit 36 also includes a p-type MOS capacitor 46 and an n-type MOS capacitor 48. The input signal IN is fed forward through feed-forward line 50 to the p-type capacitor 46 and through feed-forward line 52 to the n-type capacitor 48.

The MOS capacitors 46 and 48 introduce a delay into the transition delay circuit 36. When the input signal IN transitions from a low logic state to a high logic state, a source terminal 54 of the p-type capacitor 46 and a source terminal 56 of the n-type capacitor 48 transition from high logic states to low logic states after a delay introduced by the inverter 34. In a preferred embodiment, the inverter 34 has a large delay. After a delay introduced by the delay circuit 38, a node 58 that is common to the gate terminals of the capacitors 46 and 48 transitions from a low logic state to a high logic state. As the node 58 transitions, the gate terminal of the p-type capacitor 46 pulls minority carriers (electrons) from the substrate. Because minority carriers are being pulled, the capacitor 46 operates relatively slowly and has a reduced effect on the delay of the delay circuit 36. As the node 58 transitions and the voltage between the gate terminal of the n-type capacitor 48 and the source terminal of the n-type capacitor 48 increases, the gate terminal of the n-type capacitor 48 pulls majority carriers (electrons) from the substrate causing capacitance to be formed. This capacitance creates a delay in the delay circuit 36.

When the input signal IN transitions from a high logic state to a low logic state the source terminal 54 of the p-type capacitor 46 and the source terminal 56 of the n-type capacitor 48 transition from low logic states to high logic states after a delay introduced by the inverter 34. After a delay introduced by the delay circuit 38, the node 58 transitions from a high logic state to a low logic state. As the node 58 transitions, the gate terminal of the n-type capacitor 48 pulls minority carriers (holes) from the substrate. Because minority carriers are being pulled, the capacitor 48 operates relatively slowly and has a reduced effect on the delay of the delay circuit 36. As the node 58 transitions and the voltage between the gate terminal of the p-type capacitor 46 and the source terminal of the p-type capacitor 46 decreases, the gate terminal of the p-type capacitor 46 pulls majority carriers (holes) from the substrate causing capacitance to be formed. This capacitance creates a delay in the delay circuit 36.

After a delay introduced by the transition delay circuit 36, the signal is inverted by an inverter 59 to produce an output signal OUT.

Figure 5:
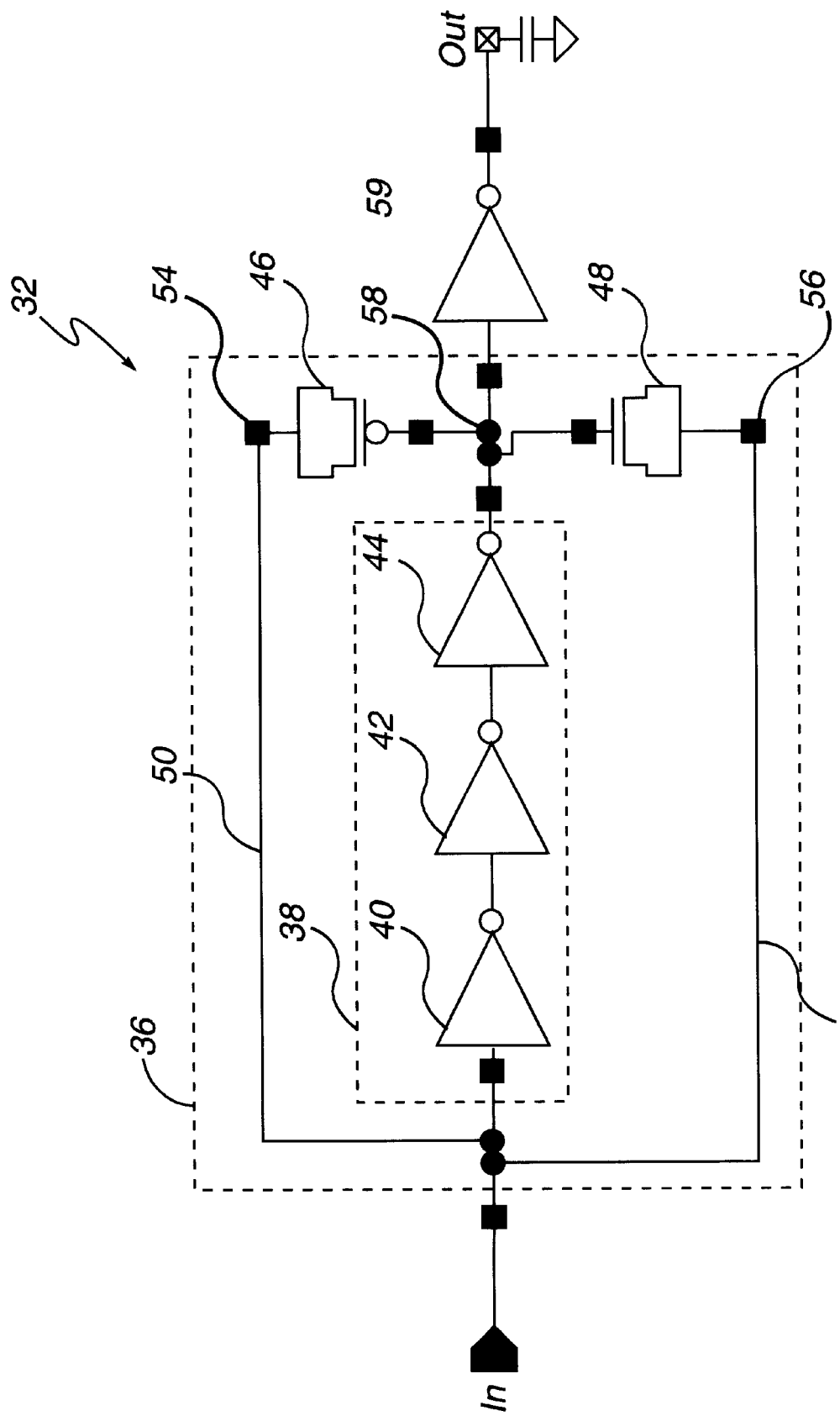
FIG. 5 is a circuit diagram of another preferred embodiment of buffer with a transition delay circuit of the present invention.

FIG. 5 illustrates a circuit diagram of a buffer 78. The buffer 78 is constructed similarly to the buffer 32 of FIG. 4. However, the buffer 78 differs from the buffer 32 in that the inverter 34 is removed. The circuit operation of the buffer 78 is similar to the operation of the buffer 32 except the input signal IN is not inverted before it is input to the transition delay circuit 36.

Figure 6:
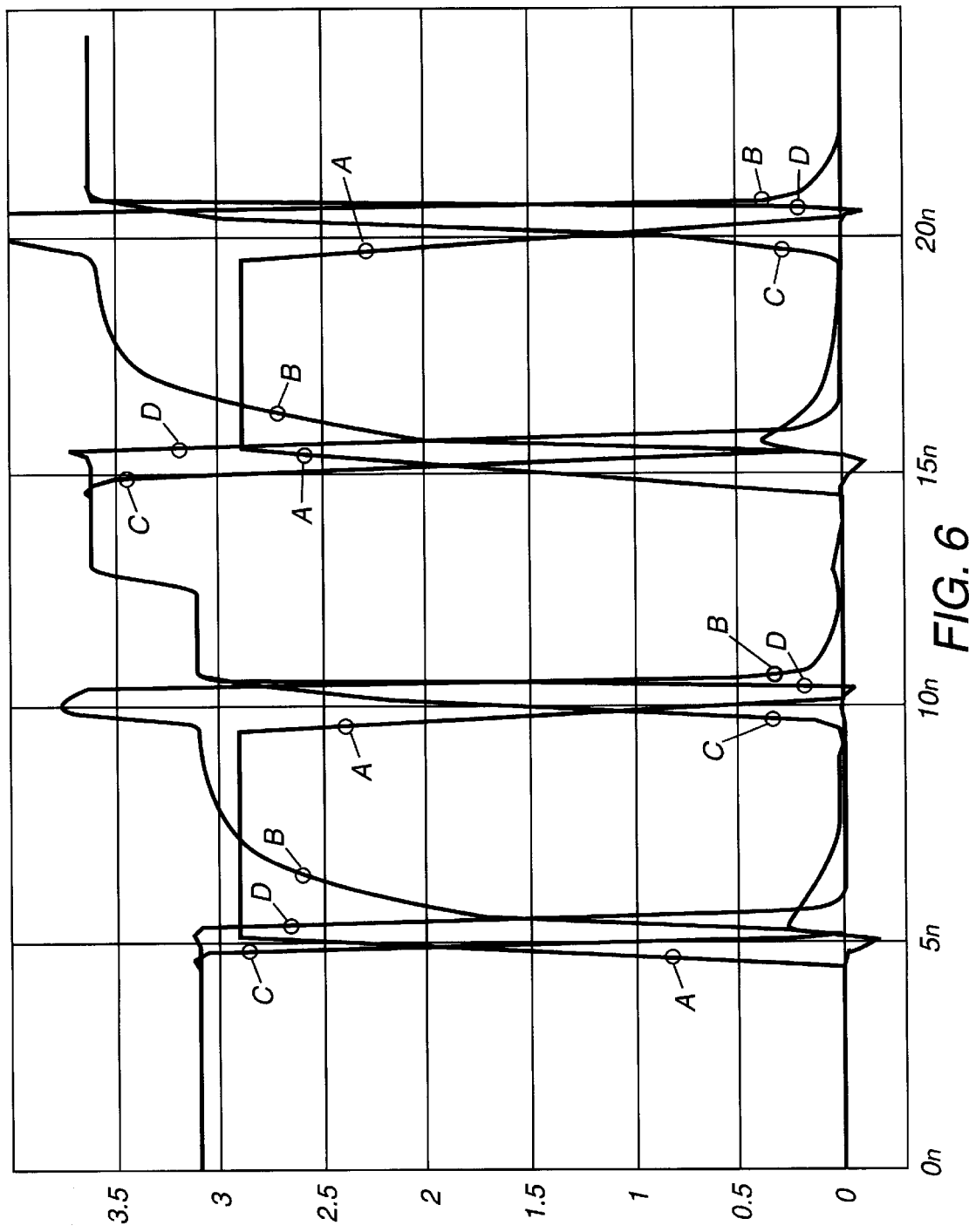
FIG. 6 is a timing diagram illustrating the operation of the buffer of FIG. 4.

FIG. 6 illustrates a timing diagram of the operation of the buffer 32 of FIG. 4. The input signal IN is represented in FIG. 6 as waveform A, the voltage at node 58 is represented as waveform B, the voltage at node 54 is represented as waveform C, and the output signal OUT is represented as waveform D. The pulses of the input signal IN (A) were peaked at 2.9 volts. The waveforms corresponding to the first pulse of the input signal IN (A) were genera-ed at Vcc=3.1 volts and the waveforms corresponding to the second pulse of the input signal IN (A) were generated at Vcc=3.6 volts.

Figure 7:
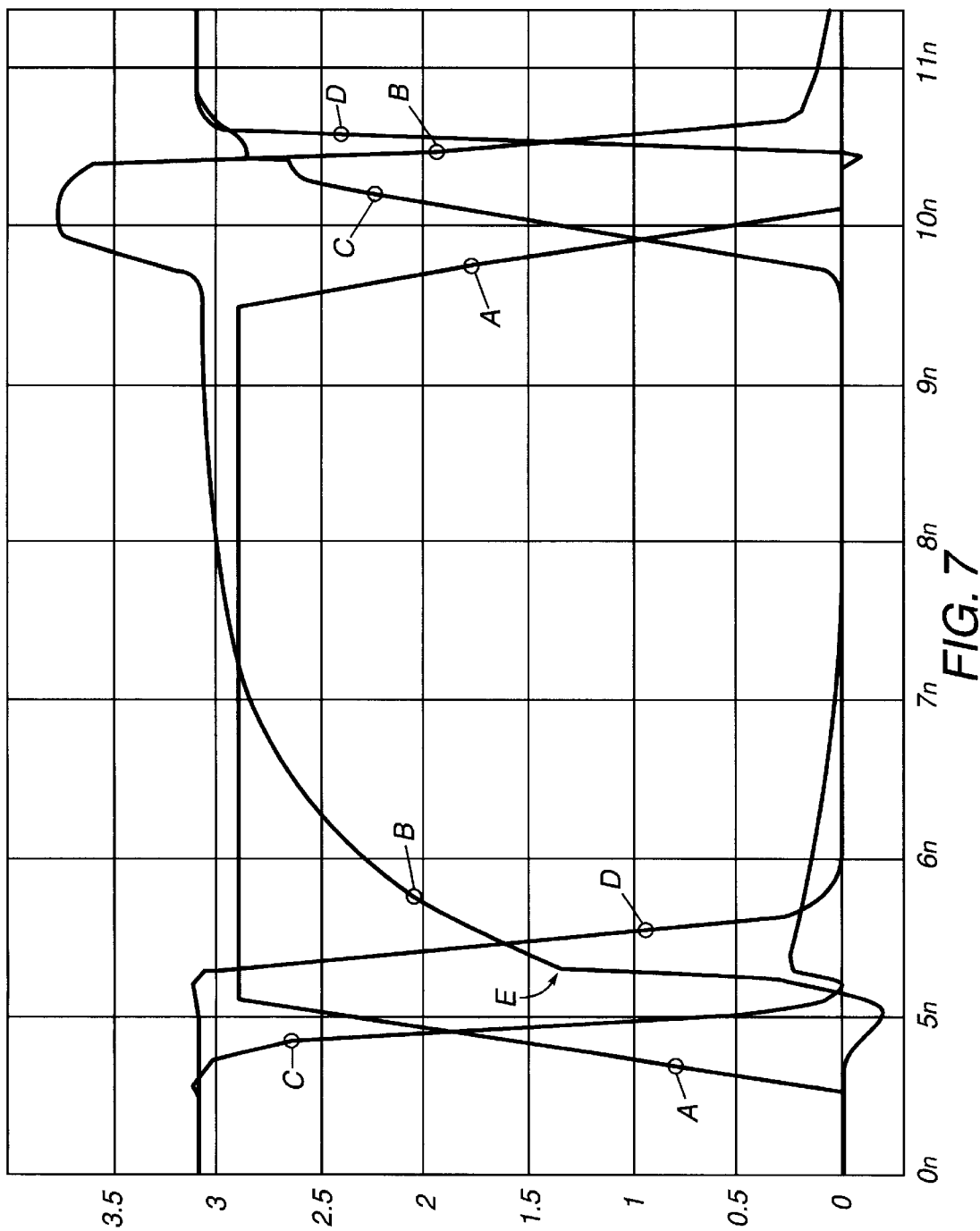
FIG. 7 is a timing diagram illustrating a portion of the timing diagram of FIG. 6 in higher resolution.

A portion of the timing diagram of FIG. 6 is shown in higher resolution in FIG. 7. The input. signal IN (A) was pulsed at 2.9 volts and Vcc was set at 3.1 volts. As the input signal IN (A) transitions from a low logic state to a high logic state, the node 54 signal (C) transitions from a high logic state to a low logic state. The node 58 transitions from a low logic state to a high logic state after passing through the inverters 40, 42, and 44. The signal reaches a high logic value at point E, as indicated in FIG. 7. The output signal OUT (D) is present at the output of the inverter 59.

A high to low transition of the input signal IN (A) is also depicted in FIG. 7. As the signal IN transitions low, the node 54 signal (C) transitions from a low logic state to a high logic state after inversion by this inverter 34. The node 58 (B) transitions from a high logic state to a low logic state after passing through the inverters 40, 42, and 44. The output signal OUT (D) is created after inversion of the node 58 by the inverter 59. It can be seen from the figure that the transition time from high to low is substantially the same as the transition time from low to high.

Figure 1:
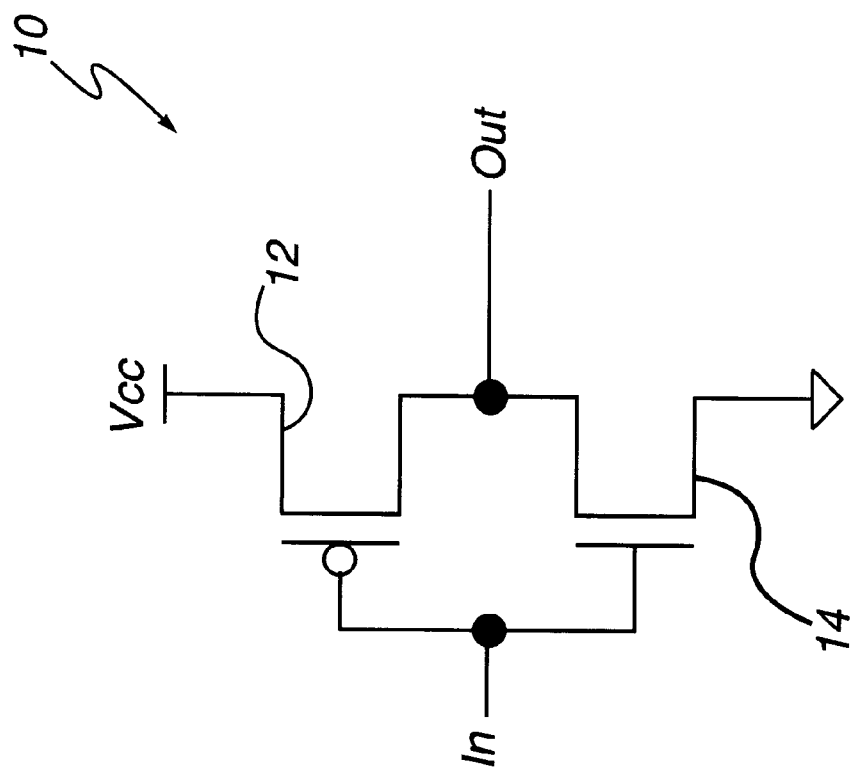
FIG. 1 is a circuit diagram of a prior art buffer.
Figure 2:
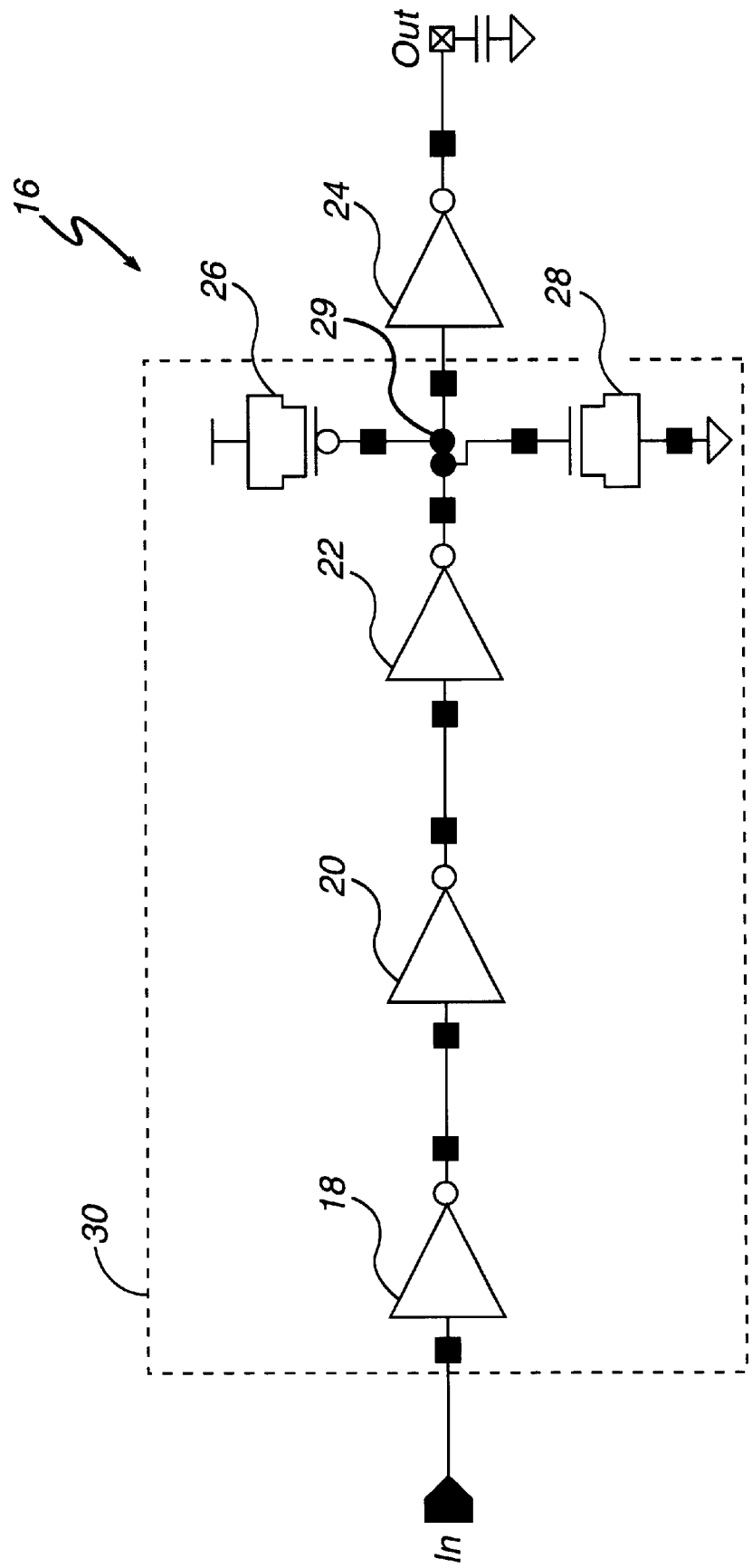
FIG. 2 is a circuit diagram of a prior art buffer with a delay circuit.
Figure 8:
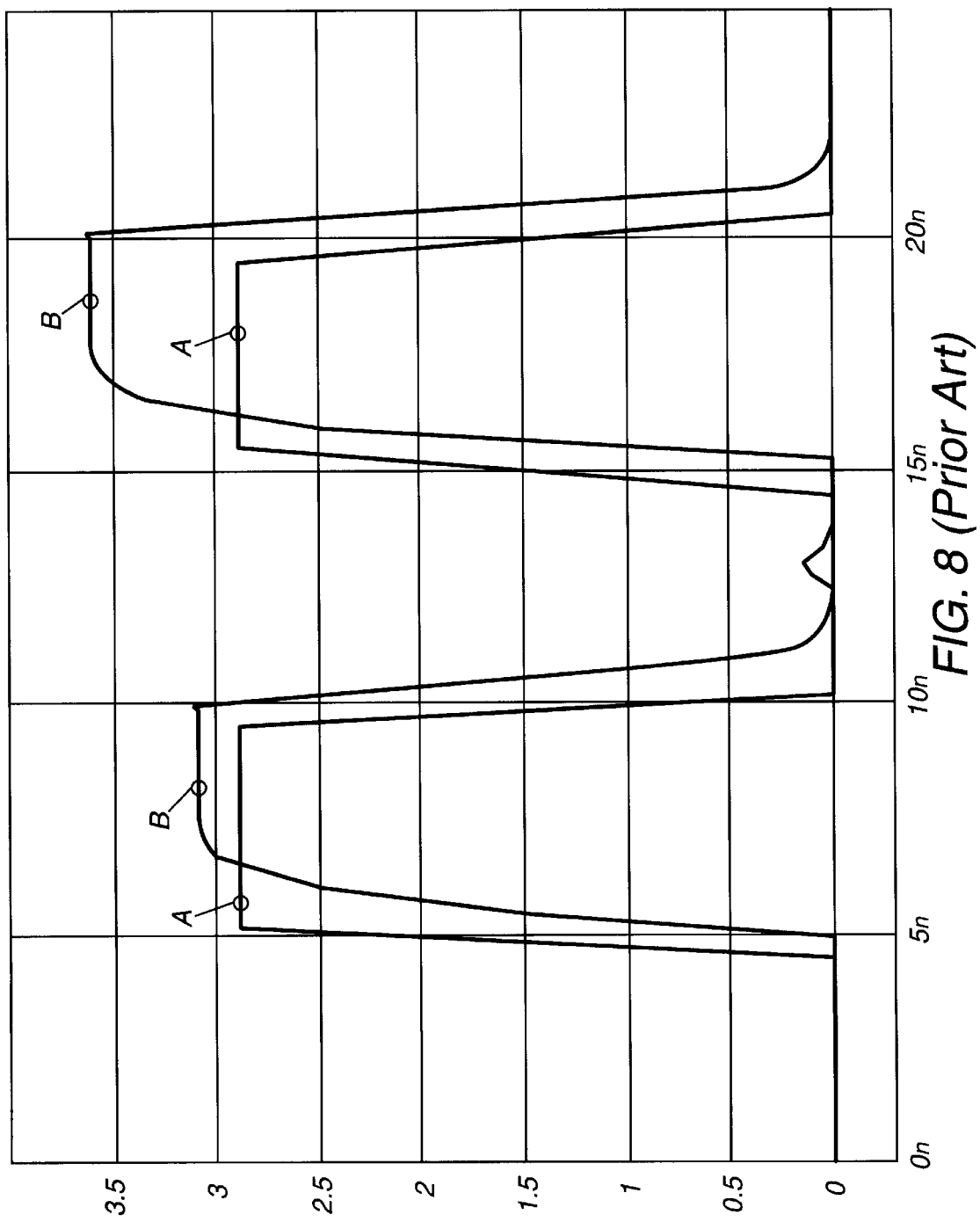
FIG. 8 is a timing diagram illustrating the operation of the buffer of FIG. 2 with an inverter added.

FIG. 8 illustrates a timing diagram of the operation of a variation of the prior art buffer 16 of FIG. 2. An inverter was added in series to the delay circuit 30 to bring the total number of inverters in the delay circuit 30 to 4. The input signal IN is represented as waveform A in FIG. 8 and the output signal OUT is represented as waveform B in FIG. 8. The input signal IN (A) was pulsed at 2.9 volts. The output signal OUT (B) waveform corresponding to the first pulse of the input signal IN (A) in FIG. 8 was generated at Vcc=3.1 volts. The output signal OUT (B) waveform corresponding to the second pulse of the input signal IN (A) in FIG. 8 was generated at Vcc=3.6 volts. From this figure it can be seen that the transition time from high to low and the transition time from low to high in the prior art circuit are not as close to being the same value as in the circuit of the present invention.

Figure 9:
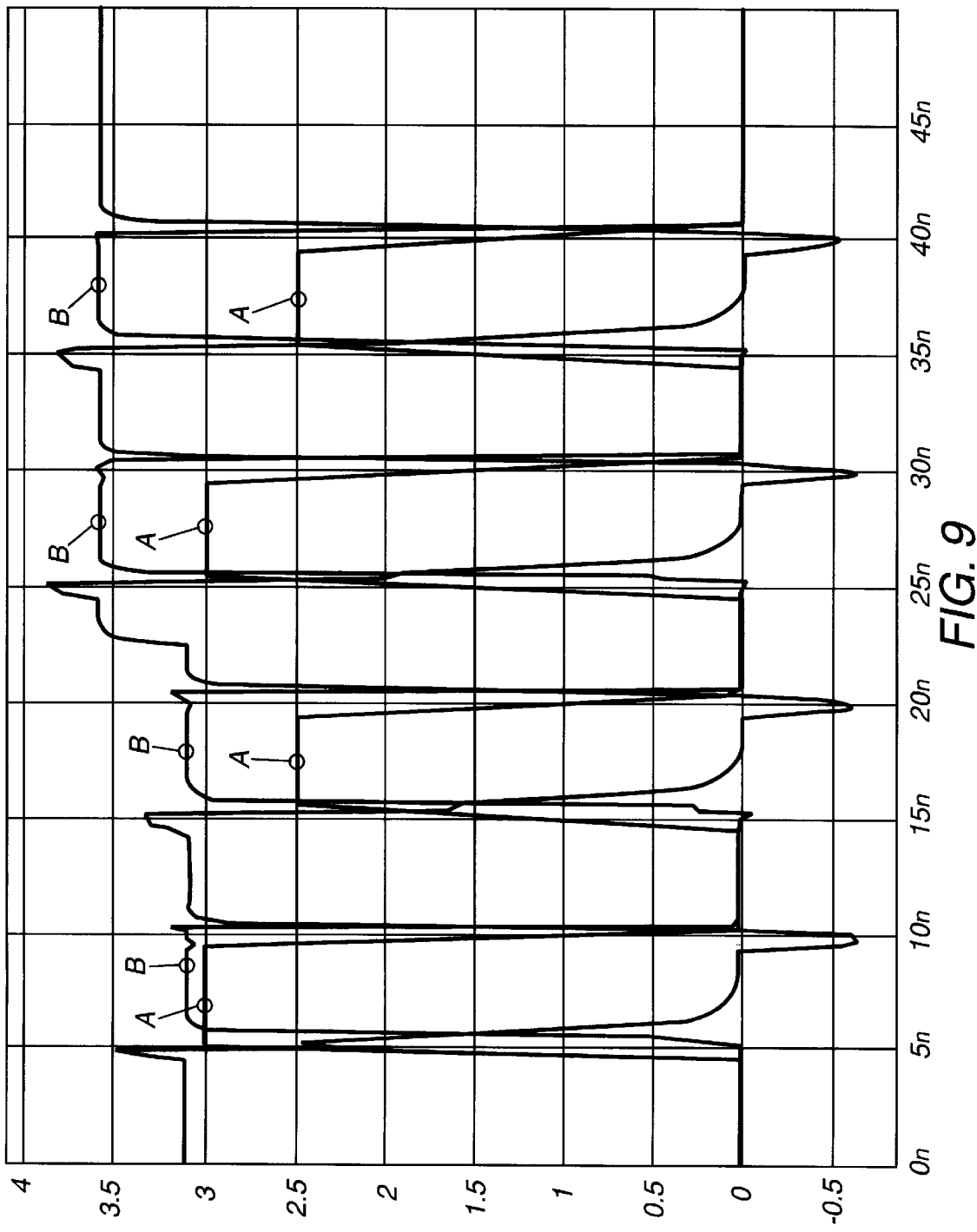
FIG. 9 is a timing diagram illustrating the operation of the buffer of FIG. 5.

FIG. 9 illustrates a timing diagram of the buffer 78 of FIG. 5. The first and third pulses of the input signal IN (A) of FIG. 9 were pulsed at 3.0 volts. The second and fourth pulses of the input signal IN (A) of FIG. 9 were pulsed at 2.5 volts. The output signal OUT (B) waveforms corresponding to the first and second pulses of the input signal IN (A) in FIG. 9 were generated at Vcc=3.1 volts. The output signal OUT (B) waveforms corresponding to the third and fourth pulses of the input signal IN (A) in FIG. 9 were generated at Vcc=3.6 volts. From this figure it can be seen that the transition time from high to low is substantially the same as the transition time from low to high.

Figure 10:
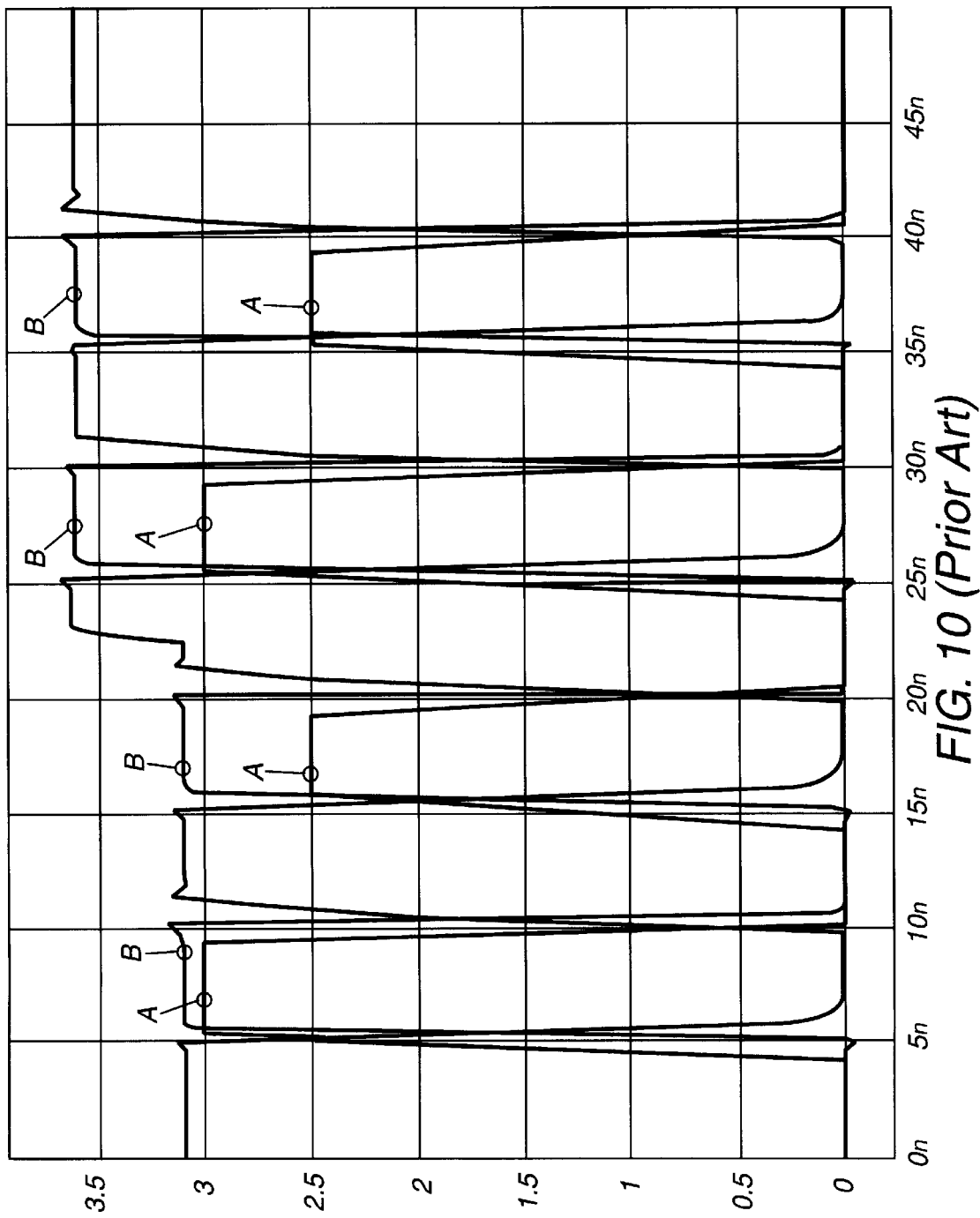
FIG. 10 is a timing diagram illustrating the operation of the buffer of FIG. 2.

FIG. 10 is a timing diagram illustrating the operation of the prior art buffer 16 of FIG. 2. The first and third pulses of the input signal IN (A) of FIG. 10 were pulsed at 3.0 volts. The second and fourth pulses of the input signal IN (A) of FIG. 10 were pulsed at 2.5 volts. The output signal OUT (B) waveforms corresponding to the first and second pulses of the input signal IN (A) in FIG. 10 were generated at Vcc=3.1 volts. The output signal OUT (B) waveforms corresponding to the third and fourth pulses of the input signal IN (A) in FIG. 10 were generated at Vcc=3.6 volts. From this figure it can be seen that the transition tire from high to low and the transition time from low to high in the prior art circuit are not as close to being the same value as the circuit of the present invention.

Figure 11:
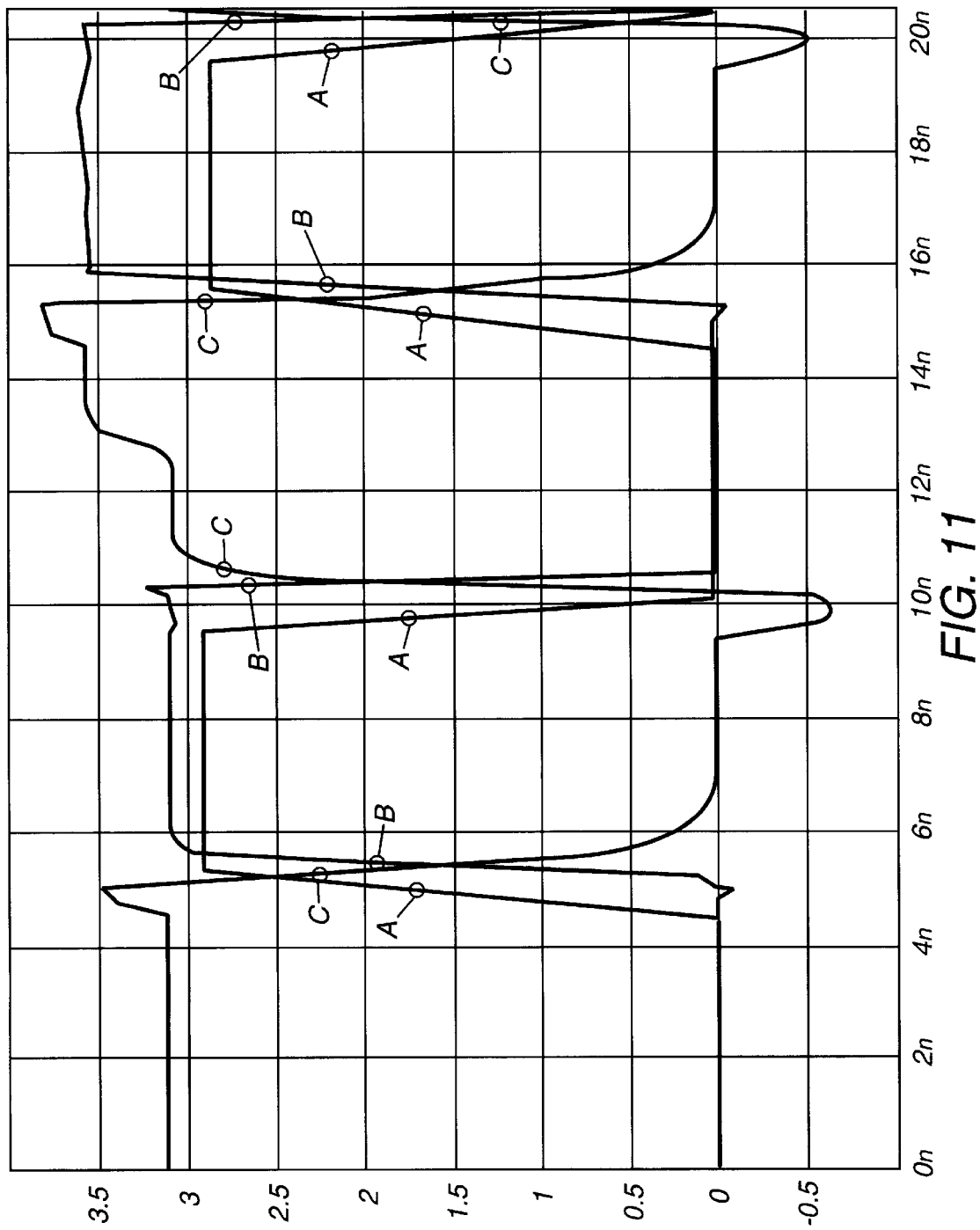
FIG. 11 is a timing diagram illustrating the operation of the buffer of FIG 5.

FIG. 11 illustrates a timing diagram of the buffer 78 of FIG. 5. The pulses of the input signal IN (A) of FIG. 11 were pulsed at 2.9 volts. The output signal OUT (B) waveform corresponding to the first pulse of the input signal IN (A) in FIG. 11 was generated at Vcc=3.1 volts. The output signal OUT (B) waveforms corresponding to the second pulses of the input signal IN (A) in FIG. 11 was generated at Vcc=3.6 volts. The signal at node 58 is represented as waveform C in FIG. 11. From this figure it can be seen that the transition time from high to low is substantially the same as the transition time from low to high.

Figure 12:
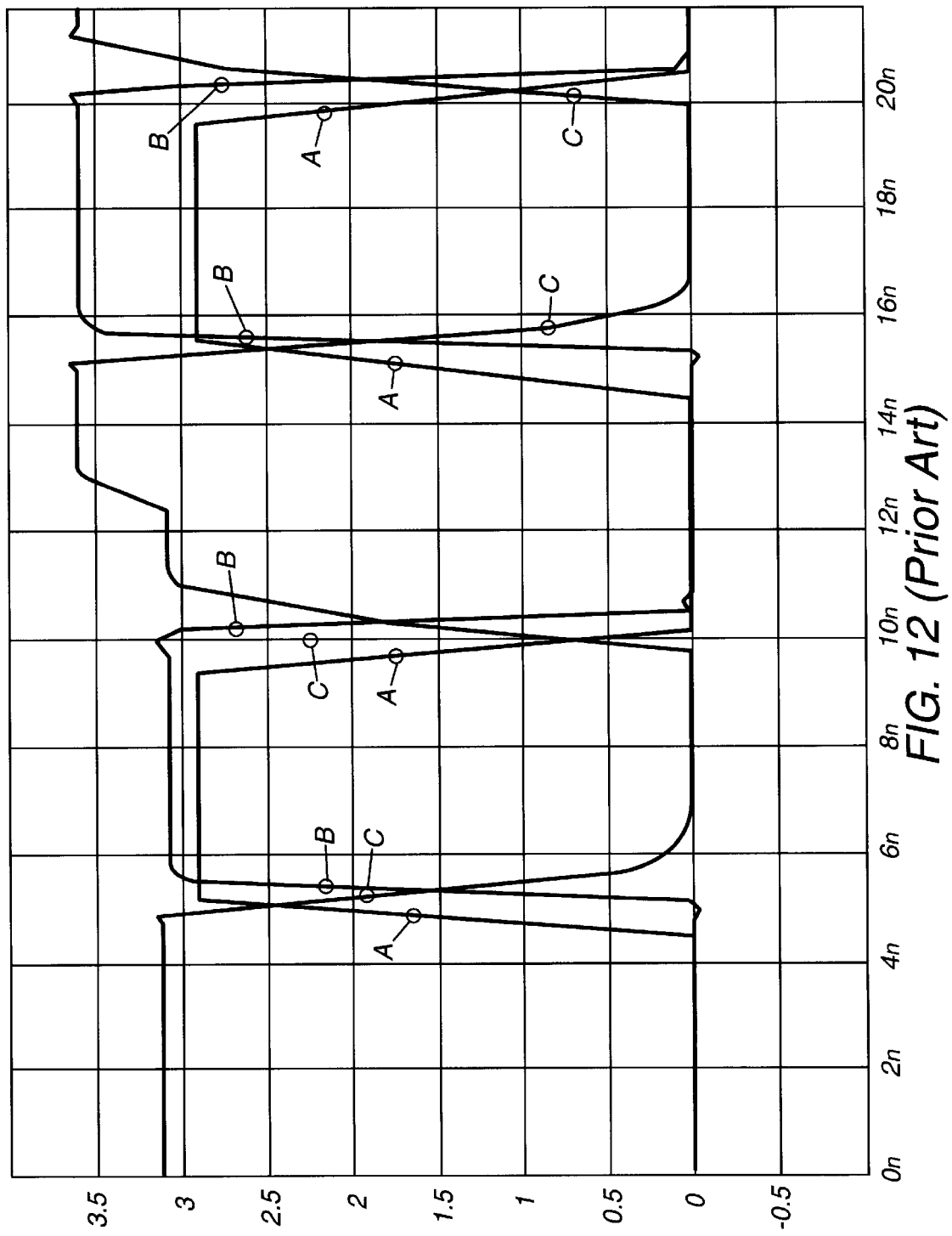
FIG. 12 is a timing diagram illustrating the operation of the buffer of FIG. 2.

FIG. 12 illustrates a timing diagram of the prior art buffer 16 of FIG. 2. The pulses of the input signal IN (A) of FIG. 12 were pulsed at 2.9 volts. The output signal OUT (B) waveforms corresponding to the first pulse of the input signal IN (A) in FIG. 12 was generated at Vcc=3.1 volts. The output signal OUT (B) waveform corresponding to the second pulse of the input signal IN (A) in FIG. 12 was generated at Vcc=3.6 volts. The signal at node 29 is represented as waveform C in FIG. 12. From this figure it can be seen that the transition time from high to low and the transition time low to high in the prior art circuit are not as close to being the same value as the circuit of the present invention.

Simulations of the buffer 32 of FIG. 4 and the buffer 78 of FIG. 5 and simulations of the prior art buffer 16 of FIG. 2 and a variation thereof were run using the HSPICE circuit simulator. The simulation results were measured after HSPICE optimized the size of the capacitors 46, 48 and 26, 28, respectively. The delay between the time when the input signal IN transitioned and the output signal OUT transitioned was measured with various combinations of Vcc and input signal voltage levels. The delay times are illustrated in Tables 1 through 4.

The first column in Tables 1 through 4 identifies whether the buffer under simulation was the prior art buffer 16 of FIG. 2 or the buffers 32 of FIG. 4 or 78 of FIG. 5. The second column in Tables 1 through 4 indicates whether the delay time was measured when the input signal IN was rising or falling. The third column indicates the peak voltage value of the input signal IN and the fourth column indicates the Vcc power supply voltage. The fifth column identifies the delay time and the sixth column indicates the difference between the output switching delay associated with the rising of the input signal IN and the output switching delay associated with the falling of the input signal IN. The seventh column indicates the difference between the greater of the output switching delays associated with each buffer at each value of Vcc and the lesser of the output switching delays associated with each value of Vcc.

From the tables it can be seen that the difference between the output switching delay associated with the rising of the input signal IN and the output switching delay associated with the falling of the input signal IN are generally substantially the same for the buffer circuit of the present invention and more disparate for the prior art buffer circuits. The magnitude of the improvement of the present invention is unexpected in that it is much greater than would have been predicted given the difference between the prior art buffer circuits and the buffer circuit of the present invention.

TABLE 1

| BUFFER | INPUT TRANSITION | VIN | VCC | DELAY (ps) | DELTA (ps) | OVERALL DELTA (ps) |
|---|---|---|---|---|---|---|
| 32 FIGS. 6,7 | Rising | 2.9 V | 3.1 V | 695 | 26 | 41 |
| 32 FIGS. 6,7 | Falling | 2.9 V | 3.1 V | 721 | | |
| 32 FIG. 6 | Rising | 2.9 V | 3.6 V | 703 | 23 | |
| 32 FIG. 6 | Falling | 2.9 V | 3.6 V | 680 | | |
| 16 + inverter FIG. 8 | Rising | 2.9 V | 3.1 V | 682 | 91 | 127 |
| 16 + inverter FIG. 8 | Falling | 2.9 V | 3.1 V | 773 | | |
| 16 + inverter FIG. 8 | Rising | 2.9 V | 3.6 V | 690 | 44 | |
| 16 + inverter FIG. 8 | Falling | 2.9 V | 3.6 V | 646 | | |

TABLE 2

| BUFFER | INPUT TRANSITION | VIN | VCC | DELAY (ps) | DELTA (ps) | OVERALL DELTA (ps) |
|---|---|---|---|---|---|---|
| 78 FIG. 9 | Rising | 3.0 V | 3.1 V | 713 | 145 | 156 |
| 78 FIG. 9 | Falling | 3.0 V | 3.1 V | 568 | | |
| 78 FIG. 9 | Rising | 3.0 V | 3.6 V | 624 | 67 | |
| 78 FIG. 9 | Falling | 3.0 V | 3.6 V | 557 | | |
| 16 FIG. 10 | Rising | 3.0 V | 3.1 V | 629 | 29 | 160 |
| 16 FIG. 10 | Falling | 3.0 V | 3.1 V | 658 | | |
| 16 FIG. 10 | Rising | 3.0 V | 3.6 V | 659 | 160 | |
| 16 FIG. 10 | Falling | 3.0 V | 3.6 V | 499 | | |

TABLE 3

| BUFFER | INPUT TRANSITION | VIN | VCC | DELAY (ps) | DELTA (ps) | OVERALL DELTA (ps) |
|---|---|---|---|---|---|---|
| 78 FIG. 9 | Rising | 2.5 V | 3.1 V | 666 | 20 | 221 |
| 78 FIG. 9 | Falling | 2.5 V | 3.1 V | 646 | | |
| 78 FIG. 9 | Rising | 2.5 V | 3.6 V | 604 | 159 | |
| 78 FIG. 9 | Falling | 2.5 V | 3.6 V | 445 | | |
| 16 FIG. 10 | Rising | 2.5 V | 3.1 V | 747 | 159 | 401 |
| 16 FIG. 10 | Falling | 2.5 V | 3.1 V | 588 | | |
| 16 FIG. 10 | Rising | 2.5 V | 3.6 V | 771 | 401 | |
| 16 FIG. 10 | Falling | 2.5 V | 3.6 V | 370 | | |

TABLE 4

| BUFFER | INPUT TRANSITION | VIN | VCC | DELAY (ps) | DELTA (ps) | OVERALL DELTA (ps) |
|---|---|---|---|---|---|---|
| 78 FIG. 11 | Rising | 2.9 V | 3.1 V | 561 | 37 | 142 |
| 78 FIG. 11 | Falling | 2.9 V | 3.1 V | 524 | | |
| 78 FIG. 11 | Rising | 2.9 V | 3.6 V | 517 | 98 | |
| 78 FIG. 11 | Falling | 2.9 V | 3.6 V | 419 | | |
| 16 FIG. 12 | Rising | 2.9 V | 3.1 V | 537 | 8 | 225 |
| 16 FIG. 12 | Falling | 2.9 V | 3.1 V | 529 | | |
| 16 FIG. 12 | Rising | 2.9 V | 3.6 V | 593 | 225 | |
| 16 FIG. 12 | Falling | 2.9 V | 3.6 V | 368 | | |

Figure 13:
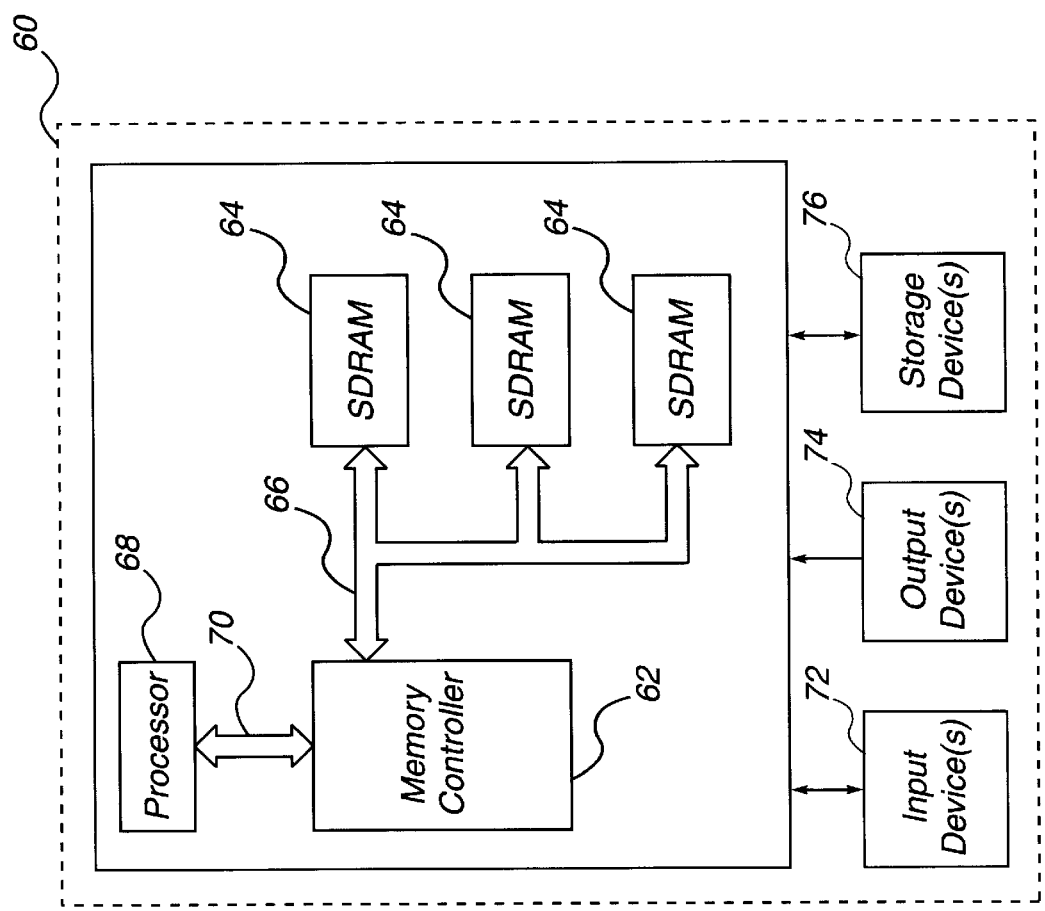
FIG. 13 is a block diagram of a system in which the present invention may be used.

FIG. 13 illustrates a computer system 60. The computer system 60 utilizes a memory controller 62 in communication with SDRAMs 64 through a bus 66. The memory controller 62 is also in communication with a processor 68 through a bus 70. The processor 68 can perform a plurality of functions based on information and data stored in the SDRAMs 64. One or more input devices 72, such as a keypad or a mouse, are connected to the processor 68 to allow an operator to manually input data, instructions, etc. One or more output devices 74 are provided to display or otherwise output data generated by the processor 68. Examples of output devices include printers and video display units. One or more data storage devices 76 may be coupled to the processor 68 to store data on, or retrieve information from, external storage media. Examples of storage devices 76 and storage media include drives that accept hard and floppy disks, tape cassettes, and CD read only memories. The buffer and transition delay circuit of the present invention can be incorporated in circuits, such as input buffer circuits, on the processor 68, the memory controller 62, and the SDRAMs 64.

The present invention also contemplates a method for delaying an input signal to a buffer circuit, comprising the steps of inputting the input signal to a delay circuit and two MOS capacitors, charging one of the MOS capacitors to produce a delayed signal, and outputting the delayed signal.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A transition delay circuit, comprising:
    a delay circuit having an input terminal responsive to an input signal and having an output terminal connected to a common node;
    a p-type MOS capacitor having a source terminal connected to said input terminal and a gate terminal connected to said common node; and
    an n-type MOS capacitor having a source terminal connected to said input terminal and a gate terminal connected to said common node.

2. The transition delay circuit of claim 1 wherein said delay circuit comprises a plurality of inverters connected serially.

3. The transition delay circuit of claim 1 wherein said delay circuit comprises three inverters connected serially.

4. A transition delay circuit, comprising:
    a delay circuit having an input terminal responsive to an input signal and having an output terminal connected to a common node;
    a first capacitor having majority and minority carriers, said first capacitor having a source terminal connected to said input terminal and having a gate terminal connected to said common node; and
    a second capacitor having majority and minority carriers opposite of said majority and minority carriers of said first capacitor, said second capacitor having a source terminal connected to said input terminal and having a gate terminal connected to said common node.

5. A buffer circuit, comprising:
    a transition delay circuit, said transition delay circuit comprising:
        a delay circuit having an input terminal responsive to an input signal and having an output terminal connected to a common node;
        a p-type MOS capacitor having a source terminal connected to said input terminal and having a gate terminal connected to said common node; and
        an n-type MOS capacitor having a source terminal connected to said input terminal and having a gate terminal connected to said common node; and
    an inverter responsive to said transition delay circuit.

6. The buffer circuit of claim 5 further comprising a second inverter responsive to said input signal and having an output terminal, wherein the source terminal of said p-type MOS capacitor is connected to the output terminal of said second inverter and the source terminal of said n-type MOS capacitor is connected to the output terminal of said second inverter.

7. The buffer circuit of claim 6 wherein said delay circuit comprises a plurality of inverters connected serially.

8. The buffer circuit of claim 6 wherein said delay circuit comprises three inverters connected serially.

9. A semiconductor device, comprising:
   a buffer circuit comprising:
      a transition delay circuit, said transition delay circuit comprising:
         a delay circuit having an input terminal responsive to an input signal and having an output terminal connected to a common node;
         a p-type MOS capacitor having a source terminal connected to said input terminal and having a gate terminal connected to said common node; and
         an n-type MOS capacitor having a source terminal connected to said input terminal and having a gate terminal connected to said common node; and
      an inverter responsive to said transition delay circuit; and
   a functional circuit responsive to said buffer circuit.

10. A system comprising:
    a processor; and
    a memory device in communication with said processor, slid memory device having at least one buffer circuit; said buffer circuit comprising:
       a transition delay circuit, said transition delay circuit comprising:
          a delay circuit having an input terminal responsive to an input signal and having an output terminal connected to a common node;
          a p-type MOS capacitor having a source terminal connected to said input terminal and having a gate terminal connected to said common node; and
          an n-type MOS capacitor having a source terminal connected to said input terminal and having a gate terminal connected to said common node; and
       an inverter responsive to said transition delay circuit.

11. A system, comprising:
    a processor; and
    a memory device in communication with said processor, wherein said processor includes a buffer circuit, said buffer circuit comprising:
       a transition delay circuit, said transition delay circuit comprising:
          a delay circuit having an input terminal responsive to an input signal and having an output terminal connected to a common node;
          a p-type MOS capacitor having a source terminal connected to said input terminal and having a gate terminal connected to said common node; and
          an n-type MOS capacitor having a source terminal connected to said input terminal and having a gate terminal connected to said common node; and
       an inverter responsive to said transition delay circuit.

* * * * *

UNITED STATES PATENT AND TRADEMARK OFFICE
CERTIFICATE OF CORRECTION

PATENT NO. : 6,154,078
DATED : November 28, 2000
INVENTOR(S) : Stave

Page 1 of 1

It is certified that error appears in the above-identified patent and that said Letters Patent is hereby corrected as shown below:

Column 1,
Line 43, immediately before the words "the input signal", please delete the word "Where" and insert the word -- When -- therefor.

Column 2,
Line 44, immediately after the word "from", please delete "t:he" and insert the word -- the -- therefor.
Line 59, immediately after the word "buffer", please delete the words "with transition" and insert the words -- with a transition -- therefor.

Column 4,
Line 48, immediately after the word "were", please delete "genera-ed" and insert the word -- generated -- therefor.

Column 5,
Line 45, immediately after the word "transition", please delete the word "tire" and insert the word -- time -- therefor.

Signed and Sealed this

Thirteenth Day of November, 2001

Attest:

*Nicholas P. Godici*

NICHOLAS P. GODICI
*Attesting Officer*   *Acting Director of the United States Patent and Trademark Office*